United States Patent Office 3,426,422

Patented Feb. 11, 1969

3,426,422

METHOD OF MAKING STABLE SEMICONDUCTOR DEVICES

Bruce E. Deal, Palo Alto, Calif., assignor to Fairchild Camera and Instrument Corporation, Syosset, N.Y., a corporation of Delaware No Drawing. Filed Oct. 23, 1965, Ser. No. 504,179
U.S. Cl. 29—571 6 Claims
Int. Cl. B01j *17/40;* H01l *7/00*

This invention concerns a novel method for preparing semiconductor devices. More particularly, this invention concerns an improved process for providing stable semiconductor devices having stable, reproducible characteristics.

In preparing various semiconductor devices, it is quite common that an aluminum layer be deposited on a silicon dioxide layer. The preparation of a number of semiconductor devices is found in Microelectronics, edited by Edward Keonjian, McGraw-Hill Book Co., Inc., New York, 1963, page 301ff. Various patents have issued which disclose the use of the silicon dioxide for masking a silicon substrate and permitting careful control of introducing dopants to provide the desired P- or N-type area. See for example U.S. Patents Nos. 3,025,589, 3,064,-167, and 3,122,817. This is frequently followed by aluminum deeposition onto the silicon dioxide to provide connections through holes in the $SiO_2$ to the N and P regions in the substrate, as well as interconnections between regions. See for example U.S. Patent No. 2,981,877.

In field effect transistors or metal-oxide semiconductor transistors (MOST's), aluminum is deposited onto a silicon dioxide layer to act as a gate in controlling the current flow between a source and a drain. Using N-type silicon and P-type source and drain regions, by applying a negative voltage bias at the aluminum gate layer, an effective P channel can be formed between the P-type source and drain, permitting the flow of current. When operating the MOST device, relatively large fields are formed across the silicon oxide layer. The nature of the MOST device makes it extremely sensitive to surface characteristics at the silicon dioxide-silicon interface. For the MOST device, it was found that prior processes of preparing the surfaces of semiconductor devices were not satisfactory. The characteristics of the MOST device prepared using prior art methods would change during use. That is, after a field was applied and removed, the MOST device would not return to its original characteristics.

Quite surprisingly, it was found that despite the extreme precautions commonly used in the preparation of semiconductor devices, extremely minute amounts of alkali metal ions, particularly sodium ions, were introduced onto the surface of the silicon oxide layer. When a field was imposed across the layer, the alkali metal ions migrated through the silicon oxide layer to the silicon oxide-silicon interface. In effect, the protective silicon dioxide mask was permeable to alkali metal ions. The presence of varying amounts of positive ions near the silicon dioxide-silicon interface creates variations in the surface charge density at the interface, resulting in changing characteristics of the MOST device. Moreover, the presence of positive ions does permit the flow of current from the aluminum to the silicon, which is also undesirable. Furthermore, if the concentration of alkali metal ions becomes sufficiently high at the interface—an extremely small number of ions when considered as a molar concentration of alkali metal ions in silicon dioxide—shorting may occur between the source and the drain.

Pursuant to this invention, semiconductor devices are provided, particularly MOST devices, which have significnatly enhanced stability. These devices are prepared by minimizing or elminating the introduction of alkali metal ions, particularly sodium, onto or into the silicon dioxide layer.

The improved method of this invention for preparing semiconductor devices having a silicon dioxide layer between an aluminum layer and a doped silicon substrate the steps of which minimize the introduction of alkali metal ions into the silicon dioxide layer, which comprises: (1) prior to the deposition of the aluminum, removing at least 10 angstroms of the layer of silicon dioxide using an alkali metal ion-free acid fluoride etchant; (2) vacuum depositing pure aluminum onto the silicon dioxide layer, in the essential absence of alkali metal ion sources, wherein said aluminum is heated, using an electron beam; and (3) forming the aluminum layer into the desired dimensions using photoresist masking techniques and an alkali metal ion-free etchant.

If desired, the following steps may also be employed: (4) when lead bonding to aluminum, serving as the gate, maintaining the aluminum at the same or at a negative bias to the silicon substrate; and (5) vigorously washing the silicon wafer with alkali-metal-ion-free water prior to bonding to a header.

Of course, the above steps are merely a few of those carried out in preparation of semiconductor devices. But, by using the above steps, significant improvements in a variety of semiconductor devices—i.e., planar transistors, field effect transistors, capacitors, etc.—can be achieved. However, the process steps are of particular importance with the MOST devices.

In order to demonstrate the improved results obtained by employing the above process steps, a relatively simple device will be used for illustration. This device referred to as a metal-oxide-semiconductor and abbreviated as "MOS" is of relatively simple construction but graphically demonstrates the effect of alkali impurities, such as sodium ions, on the performance of semiconductor devices. The results obtained from the MOS device can be readily applied to more sophisticated devices such as the MOST.

In the MOS device, silicon dioxide acts as the dielectric portion of the capacitor between the substrate silicon and evaporated aluminum; the aluminum is used for the field plate. With the exception of the novel process steps of this invention for the deposition of aluminum onto a silicon dioxide surface, the remainder of the preparation of the MOS device follows conventional semiconductor device fabrication. The process provides a simple, but relatively complete example of the various steps involved in the fabrication of most semiconductor devices. The significant difference between the preparation of the MOS device and other more sophisticated devices is that MOS device does not employ any further doping of the silicon substrate, while in MOST devices, the silicon substrate is further doped to provide PN junctions.

In preparing the MOS devices used for testing, the material used was in the form of boron-doped, P-type circular slices of about 19–25 mm. in diameter, lapped on both sides to 250 microns. The resistivity was about 1.3 ohm-cm. The slices were cleaned by thorough washings, first with hot trichlorethylene, followed by acetone, cold deionized water, hot deionized water, a 1:1 mixture of hot nitric and sulfuric acid and finally twice with deionized water. Immediately after the cleaning, the surfaces were etched using etching solution of four parts of concentrated hydrofluoric acid with ten parts of concentrated nitric acid. The slices were then quenched in acetic acid and rinsed in deionized water. About 50 microns per side of silicon was removed by the etching process, leaving wafers of about 150 microns thickness.

Immediately after the above etching, the slices were oxidized using either wet or dry oxygen. The oxidation was carried out in a fused quartz tube, in a constant temperature oven at temperatures between 920° and 1200° C. The dry oxygen was purified using a molecular sieve trap. Wet oxygen was obtained by bubbling the oxygen through water maintained at 95° C. To obtain an oxide thickness of 0.20 micron (2,000 angstroms) at 1200° C., sixty minutes was required for dry oxygen and 4.25 minutes for wet oxygen. No significant difference was found in the final results as a result of using either the wet or dry oxidation process.

After oxidation, the wafers were treated with an aqueous solution of hydrofluoric acid prepared by diluting one part of concentrated hydrofluoric acid with ten parts of water for 10 seconds. Approximately 50 angstroms of oxide was removed by this action, leaving somewhat less than about 2,000 angstroms of silicon dioxide. Various acid fluoride etchants may be used, depending upon the rapidity with which the etching is desired. By varying the concentration of hydrofluoric acid, different rates of removal of silicon dioxide can be achieved. The important aspect of this invention is that the presence of alkali metal ions in the etchant may be minimized or completely eliminated.

The wafers were now ready to be metallized by aluminum vacuum deposition. Electron beam evaporation of aluminum is well known and thoroughly described in Holland, "Vacuum Deposition of Thin Films," Wiley (New York, 1956), particularly chapter 4. The wafers were mounted in quartz holders and placed in an 18-inch diameter bell jar 30 inches high, having approximately 100-liter capacity. The pressure was reduced to $1 \times 10^{-6}$ mm. Hg. The electron beam system employed connected the substrate and gun at ground and the aluminum at a high positive potential. The aluminum was melted and a small amount distilled off before depositing the aluminum onto the wafer. A layer of aluminum of between about 500 and 10,000 angstroms is deposited. Whenever possible, the highest purity of aluminum should be used that is available. Aluminum of 99.9999% (six nines) purity is reported to be commercially available and is preferable. Preferably a 3,000–5,000 angstrom aluminum layer was deposited onto the silicon dioxide layer.

During the aluminum deposition, the bell jar was shielded using a steel shield thick enough to absorb X-ray and beta radiation. Other metals could be employed, such as lead, copper, etc. The shield should be of a material which is almost totally alkali metal ion-free and capable of absorbing any high energy radiation which might free alkali metal ions from any alkali metal ion source, e.g., glass, alkali metal ion containing connectors, etc. Whenever possible, all fixtures and connections in the system used during the deposition should be free of alkali metal ions or shielded from stray radiation.

By using conventional photoresist or photoengraving techniques, the top silicon dioxide and aluminum layer were masked and the back silicon dioxide removed by etching, using an acid fluoride etchant free of alkali metal ions, particularly sodium ions, e.g., ammonium bifluoride. The resist film was then removed using a highly purified organic solvent free of alkali metal ions and by again employing conventional photoresist techniques, the aluminum layer reduced in size to a desired size dot—10 mil diameter with 50 mil center. The etchant used was an alkali metal ion-free etchant, such as phosphoric acid. Various forms of phosphoric acid may be used and conventional aluminum etchants may be used as long as they do not contain alkali metal ions (such as sodium hydroxide).

An aluminum layer is now deposited on the bottom portion of the silicon using the electron beam evaporation and vacuum deposition techniques previously described. A layer of about 3,000–5,000 angstroms thickness is provided. In order to provide satisfactory adherence between the silicon dioxide and the aluminum, as well as between the silicon and the aluminum, the wafer is heat-treated at a temperature in the range of about 500 to the eutectic temperature for silicon dioxide and aluminum, usually about 550–570° C. for about one to ten minutes.

Leads may now be bonded to the metal surfaces by various means, such as ultrasonic bonding, thermo-compression bonding either in oxygen or in an atmosphere of nitrogen, preferably the latter, or other convenient means. The leads may be gold, aluminum, or other materials. When bonding a lead to the aluminum layer, particularly the lead to the top aluminum layer or dot, the aluminum should be maintained at the same or at a negatively biased potential with respect to the silicon substrate. In this manner, any tiny amounts of stray sodium or other alkali metal ions which may still remain upon the silicon dioxide surface are not driven into the silicon dioxide layer. Preferably, the wafers are first vigorously washed with deionized water in order to remove any traces of stray alkali metal ions which might be on the surface of the silicon dioxide layer.

Various MOS devices were prepared following the procedure described above. The oxide layer was prepared using dry oxygen at 1200° C. for 60 minutes to provide an oxide thickness of 0.20 microns. The aluminum field plate diameter is 0.015 inch. The silicon substrate is P-type (111) crystal-oriented, boron-doped, $C_B = 1.4 \times 10^{16}$ cm.$^{-3}$. Numerous devices were prepared in each case, changing only one variable, all other process steps being optimum. The ΔV represents change in reference or "turn on" voltage after subjecting the device to ±10 volts at 300° C. for 2 minutes. The following table indicates the results obtained.

| Process condition [1] | ΔV volts |
|---|---|
| Removal of 50 A. $SiO_2$ prior to metallization | <1.0 |
| No $SiO_2$ removed | 20 |
| High purity aluminum (99.9999%) | <1.0 |
| Regular aluminum (99.99%) | 10 |
| Electron beam aluminum evaporation | <1.0 |
| Filament aluminum evaporation | >60 |
| Shielded electron beam evaporation | <1.0 |
| Non-shielded | 10 |
| Grounded lead bond | <1.0 |
| None-grounded lead bond | 5.0 |

[1] All pairs were processed at the same time to provide direct comparison under the same conditions.

Most devices were prepared using silicon wafers prepared as described previously. The silicon wafers were N-type and about 1–2 ohm-cm. resistivity. After etching the wafer using a conventional etch containing HF, HNO and HA*c* to a $170 \pm \mu$ thickness, the wafer was oxidized with steam for 30 minutes at 1200° C. to provide a 6,000 angstrom silicon dioxide layer. After etching openings in the silicon dioxide layer for diffusing the boron dopant, boron tribromide was predeposited using a mixture of oxygen and nitrogen to volatilize the boron tribromide and carry it into the oven where the wafer was maintained at 1,020° C.

After predepositing a sufficient amount of boron tribromide, the wafer was then dipped for 15 seconds in a 2:1 concentrated hydrofluoric acid:water solution. In order to diffuse the boron into the silicon and to simultaneously form an additional silicon dioxide coating, the wafer was then heated for 30 minutes in the presence of dry oxygen, followed by 30 minutes in the presence of steam, followed by an additional 30 minutes in the presence of nitrogen, all at 1200° C. After nickel plating the back side of the wafer, the back was sanded, and the wafer dipped in hydrofluoric acid for 30 seconds. The wafer was then oxidized and annealed by heating at 1200° C., for 20 minutes in the presence of dry oxygen, followed by 20 minutes in the presence of dry nitrogen. Using conventional photoresist techniques, the oxide over the gate was thinned to 1200 angstroms by etching in a buffered HF etch for 9 minutes, followed by removal of the protective coating. Prior to depositing the aluminum layer, the areas to be protected were coated using conventional photoresist techniques. The wafer was dipped in a 10:1 concentrated hydrofluoric acid:water solution for 10 seconds, followed by aluminum deposition using electron beam evaporation to form a layer of from about 4,000–5,000 angstroms thick. Using conventional photoresist techniques, the aluminum was reduced to the desired size dot. The wafer was then heated for 5 minutes at 565° C. under nitrogen. The MOST was then ready to have leads bonded to the aluminum and nickel layers. The aluminum was kept at the same or a negative bias with respect to the silicon substrate during bonding. The device was then washed ready for testing.

When the MOST device was prepared according to the method described previously, the characteristics were found to remain constant and to be reproducible. The device was maintained with an applied field of ±10 volts at 200° C. for 10 minutes. The MOST devices, when prepared according to the process of this invention, were found to be stable at elevated temperatures, i.e., 200° C. for long periods of time under a significant field. Contrastingly, devices prepared by the prior art processes would exhibit changes in threshold voltage as well as other characteristics of large orders of magnitude when similar electrical fields were applied at such temperatures. For example, MOST devices using the procedure described above, have less than a 1/10 volt change in turn-on voltage when a +10 volt field was applied for 30 minutes at 127° C.

Contrastingly, devices were prepared according to the prior art, not employing the process steps of this invention, changes in voltage of up to 100 volts occurred under similar conditions. The ability to provide stable devices has a further advantage that devices can be prepared repeatedly having the same or approximately the same electrical characteristics.

It will be understood that the invention in its broader aspects is not limited to the specific examples described.

What is claimed is:

1. In an improved method for preparing semiconductor devices having a silicon dioxide layer between an aluminum layer and a doped silicon substrate, the steps of which minimize the introduction of alkali metal ions into the silicon dioxide layer, which comprises:

prior to the deposition of the aluminum, removing at least 10 angstroms of the layer of silicon dioxide using an alkali metal ion-free acid fluoride etchant, vacuum depositing pure aluminum into the silicon dioxide layer, in the essential absence of alkali metal ion sources, wherein said aluminum is heated using an electron beam, and forming the aluminum layer into the desired dimensions using photoresist masking techniques and an alkali metal ion-free etchant.

2. In an improved method for preparing semiconductor devices having a silicon dioxide layer between an aluminum layer and a doped silicon substrate, the steps of which minimize the introduction of alkali metal ions in the silicon dioxide layer, which comprises:

prior to the deposition of the aluminum, removing at least about 1,000 to about 10 angstroms of silicon dioxide from the silicon dioxide layer using an alkali metal ion-free acid fluoride etchant, vamuum depositing an aluminum layer of from about 500 to 10,000 angstroms thickness, in the essential absence of alkali metal ion sources, wherein said aluminum is heated using an electron beam, and forming the aluminum layer into the desired dimensions using photoresist masking techniques and an alkali metal ion-free etchant.

3. A method according to claim 2 wherein the aluminum layer is etched using a phosphoric acid etchant.

4. A method according to claim 2 including the additional step of distilling a small amount of aluminum prior to vacuum deposition of the aluminum onto the silicon dioxide layer.

5. A method according to claim 2 including the additional step of bonding leads to the aluminum layer while maintaining the aluminum layer at the same or negative bias potential with respect to the silicon substrate.

6. A method according to claim 5 wherein the device is vigorously washed with an alkali metal ion-free water after bonding.

References Cited

UNITED STATES PATENTS

| | | | |
|---|---|---|---|
| 2,906,647 | 9/1959 | Roschen | 29—590 X |
| 3,080,481 | 3/1963 | Robinson | 29—576 X |
| 3,226,613 | 12/1965 | Haenichen. | |
| 3,258,663 | 6/1966 | Weimer. | |

WILLIAM I. BROOKS, *Primary Examiner.*

U.S. Cl. X.R.

29—590; 156—17; 117—213